(12) United States Patent
Van der Plas et al.

(10) Patent No.: US 7,652,600 B2
(45) Date of Patent: Jan. 26, 2010

(54) A/D CONVERTER COMPRISING A VOLTAGE COMPARATOR DEVICE

(75) Inventors: Geert Van der Plas, Leuven (BE); Johan Bauwelinck, Temse (BE); Zhisheng Li, Ghent (BE); Guy Torfs, Ghent (BE); Jan Vandewege, Mariakerke-Ghent (BE); Xin Yin, Ghent (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 12/191,059

(22) Filed: Aug. 13, 2008

(65) Prior Publication Data

US 2009/0066555 A1 Mar. 12, 2009

Related U.S. Application Data

(63) Continuation-in-part of application No. 12/162,814, filed as application No. PCT/EP2007/050945 on Jan. 31, 2007.

(30) Foreign Application Priority Data

Jan. 31, 2006  (EP)  .................................. 06447016

(51) Int. Cl.
H03M 1/10 (2006.01)
(52) U.S. Cl. ....................... 341/120; 341/155; 341/159; 327/55; 327/57; 327/63
(58) Field of Classification Search ................. 341/120, 341/159
See application file for complete search history.

(56) References Cited

U.S. PATENT DOCUMENTS 6,008,673 A * 12/1999 Glass et al. .................... 327/77
6,121,913 A *  9/2000 Glass et al. .................. 341/159
6,147,514 A * 11/2000 Shiratake ...................... 327/55

* cited by examiner

Primary Examiner—Khai M Nguyen
(74) Attorney, Agent, or Firm—McDonnell Boehnen Hulbert & Berghoff LLP

(57) ABSTRACT

The present invention discloses an analogue-to-digital converter comprising at least two voltage comparator devices. Each of the voltage comparator devices comprises a differential structure of transistors and is arranged for being fed with a same input signal and for generating an own internal voltage reference by means of an imbalance in the differential structure, said two internal voltage references being different. Each voltage comparator is arranged for generating an output signal indicative of a bit position of a digital approximation of the input signal.

18 Claims, 8 Drawing Sheets

A/D CONVERTER COMPRISING A VOLTAGE COMPARATOR DEVICE

This application is a CIP of 12/162,814 filed Nov. 4, 2008 which is of PCT/EP2007/050945 filed Jan. 31, 2007 that claims priority to European Patent Application 06447016.4 filed Jan. 31, 2006.

Field of the Invention

The present invention relates to the field of analogue-to-digital converters wherein voltage comparator devices are used.

State of the Art

Emerging applications in the wireless sensor arena, such as multi-band OFDM and pulsed Ultra-Wide Band (UWB) systems for wireless personal area networks, impose very stringent requirements on transceivers. Minimum energy consumption is a must, but good receiver performance is nonetheless needed for a large signal bandwidth. As a consequence, very demanding requirements on speed, bandwidth and power specifications of the analogue-to-digital converter (ADC) exist in the receiver front-end and make the design extremely challenging. Most of the reported ADCs for similar applications employ interleaving, with each channel typically based on flash converters. Beside the high sampling rates, flash ADCs guarantee the smallest number of clock cycles per conversion and minimum latency. Moreover, in low resolution applications power consumption can still be contained.

When implementing ADCs with a reduced number of bits, flash converters provide a viable solution for low-power implementations. A drawback of traditional flash architectures is the large static power consumption in the preamplifier chain (to implement comparators) as well as in the reference resistive ladder because of the small resistance values required to overcome the signal feed-through problem.

In the paper "A current-controlled latch sense amplifier and a static power-saving input buffer for low-power architectures" (T. Kobayashi, IEEE J. Solid State Circuits, vol. 28, no. 4, pp. 523-527, April 1993) an architecture for a fast dynamic regenerative structure has been proposed. In the paper "Low-Power Area-Efficient High-Speed I/O Circuit Techniques", M-J. E Lee et al., IEEE J. Solid State Circuits, vol. 35, no. 11, pp. 1591-1599, November, 2000 a capacitor based offset compensation is presented. In this paper the same threshold voltage is implemented in different comparators clocked at different times to detect when a signal crosses one single level.

AIMS OF THE INVENTION

The present invention aims to provide an A/D converter comprising at least two voltage comparator devices arranged for generating their own internal voltage reference.

SUMMARY OF THE INVENTION

The present invention relates to an analogue-to-digital (A/D) converter comprising at least two voltage comparator devices. Each of the voltage comparator devices is arranged for being fed with a same input signal and for generating an own internal voltage reference. The two internal voltage references are different. Each voltage comparator is arranged for generating an output signal indicative of a bit position of a digital approximation of said input signal.

Advantageously the voltage comparator devices comprise a plurality of transistors, whereby the internal voltage reference is realized by configuring at least some of the transistors such that a voltage imbalance is achieved between the output signals of the two voltage comparator devices.

Preferably at least one of the voltage comparator devices further comprises capacitors for calibrating transistor mismatches. In a preferred embodiment the capacitors are switchable.

In an embodiment of the invention in order to avoid slowing down the operation of the comparator device, said capacitors are selected such that small capacitors are used, preferably the capacitance of half MOS transistors are used, more preferably in a differential circuit configuration, wherein the difference between two of said capacitances of said half MOS transistors is used.

The analogue-to-digital converter according to the invention comprises in a further embodiment at least two of said voltage comparator device. Such an analogue-to-digital converter has as advantage low power consumption.

In one embodiment said analogue-to-digital converter comprises memory for storage of calibration information for selecting said capacitors for transistor mismatch calibration.

The invention further relates to ultra-wide band receivers comprising at least one of said analogue-to-digital converters.

The invention further relates to calibration methods for analogue-to-digital converters as described above, in order to perform among others offset compensation/correction.

The invented approach describes the following aspects to be used separately or in combination.

In a first aspect the use of an off-line calibration approach is disclosed, hence the use of a calibration technique when the analogue-to-digital converter is not normally operated.

In a second aspect the use of a calibration approach is disclosed, wherein the calibration criterion is posed in terms of the threshold values of each of the voltage comparator device, rather than in terms of the switching levels of the analogue-to-digital converter itself. This has the advantage that a calibration approach, wherein each of the voltage comparator devices of said analogue-to-digital converter is calibrated separately, is enabled.

In a third aspect the calibration approach exploits the output of the analogue-to-digital converter itself, rather than the output of the to be calibrated voltage comparator device, which has the advantage that no additional output means for the direct output of the to be calibrated voltage comparator is needed.

SHORT DESCRIPTION OF THE DRAWINGS

DETAILED DESCRIPTION OF THE INVENTION

Figure 1A:
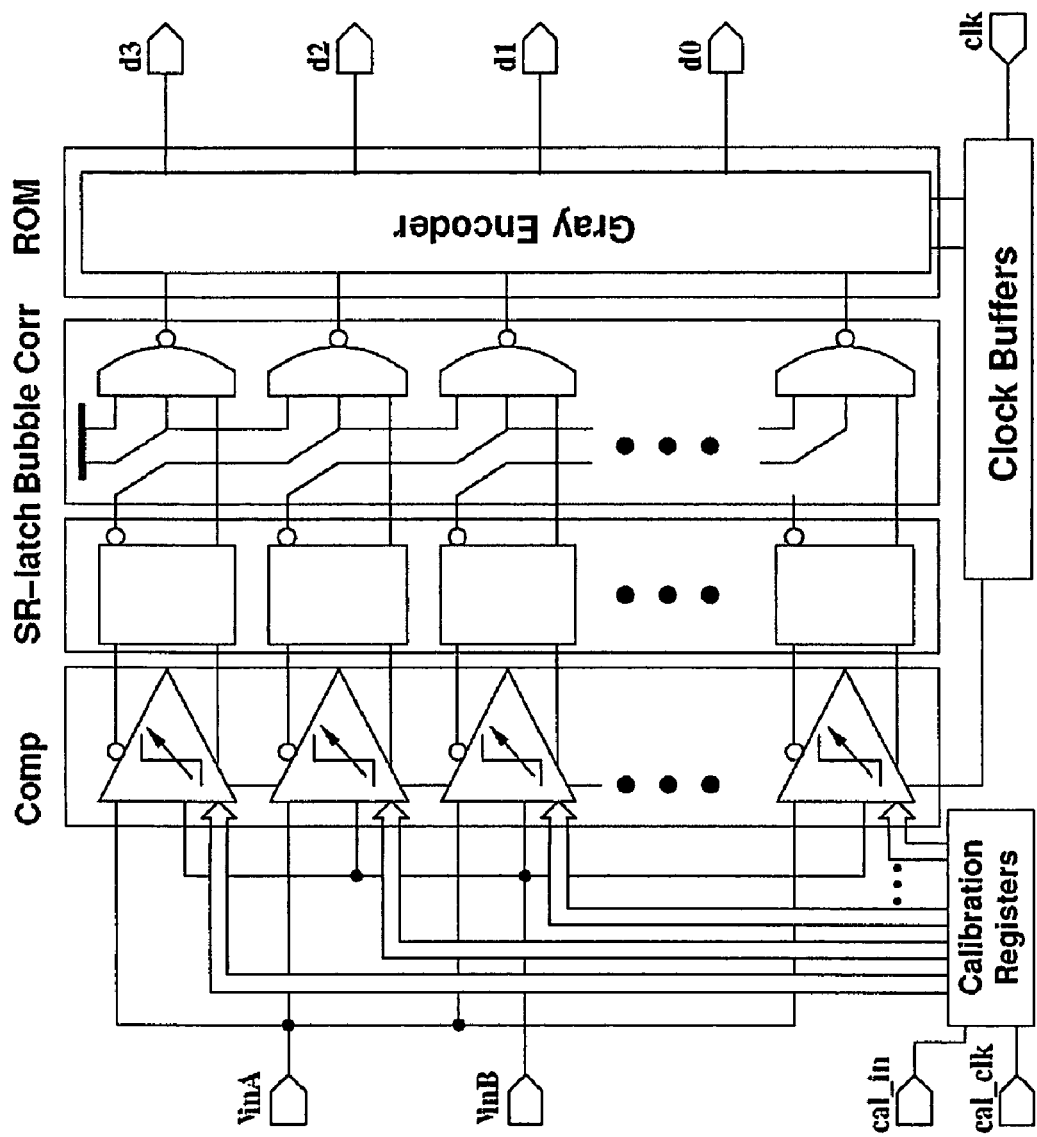
FIG. 1 represents the architecture of an A/D converter according to the present invention.
Figure 1B:
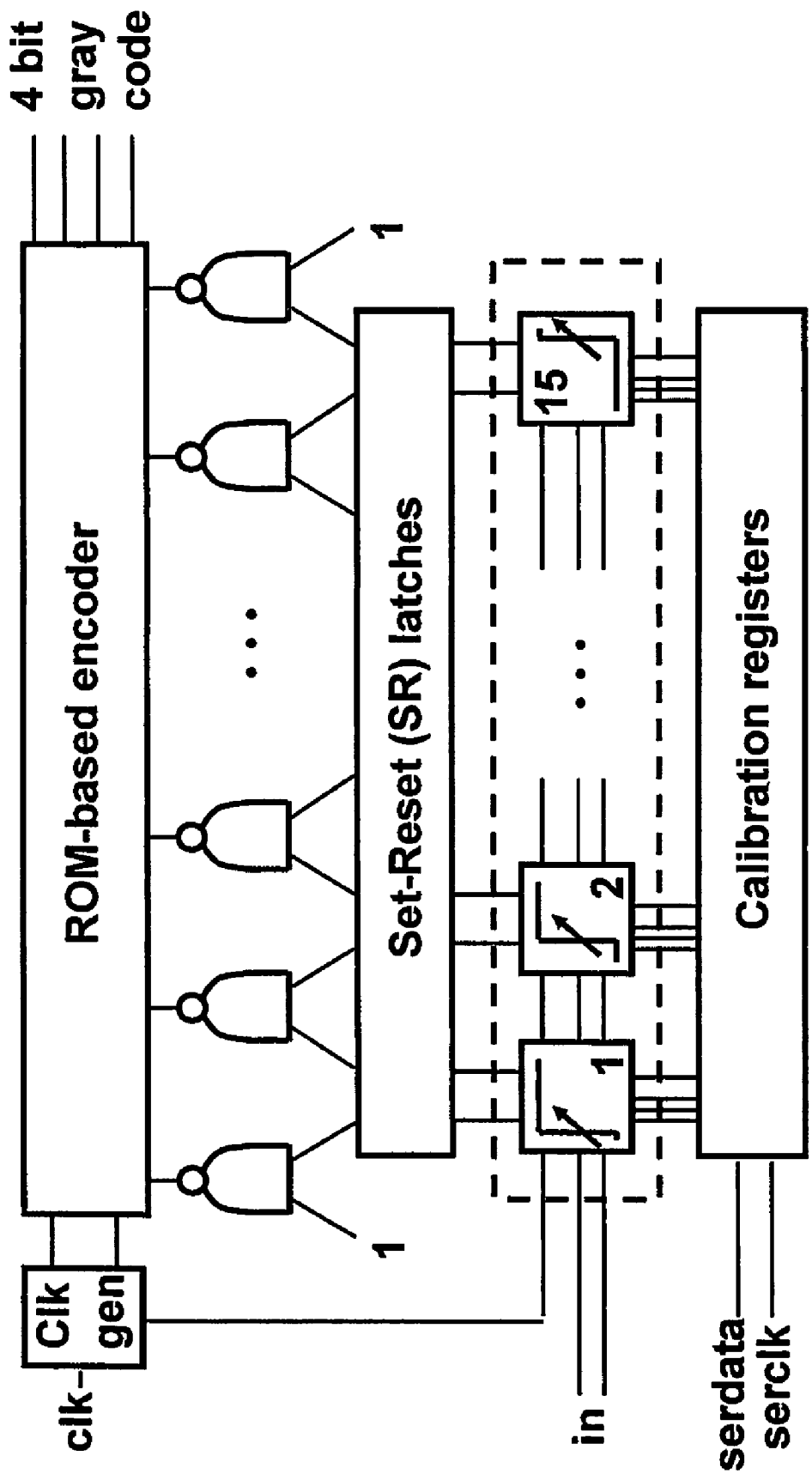

In the solution according to the present invention, as shown in FIG. 1, a latch-type dynamic comparator is used both to sample (without using a specific track-and-hold circuit) and amplify the input signal, without static power consumption. Moreover, thresholds are embedded in the comparator chain through proper imbalance in the sizes of the input transistors, thus avoiding power consuming circuits to generate reference voltages. In the invention multiple levels are implemented in different comparators to detect at a single point in time the value of the signal.

In order to provide a low ADC differential input capacitance, the comparator area has been minimised. Therefore, the converter accuracy would be irreparably impaired if offset compensation and fine threshold tuning were not performed. For this purpose, a dynamic offset correction technique is applied which allows foreground ADC calibration through a set of digital words (one for each comparator) stored in the calibration registers.

Each comparator is then followed by an SR(set/reset)-latch to generate a 'thermometer code' for the ADC back-end and increase the global regeneration gain. A thermometer code is a code wherein from the LSB position on towards the MSB position a number of consecutive 1's occur and wherein the remaining positions up to the most significant bit, if any, are 0's. This contributes to reducing the error probability due to comparator metastability (i.e. ambiguity whether a digital output of the comparator is a one or a zero) in presence of very small signals, especially after preamplifiers have been removed. A first order bubble correction stage follows the latch chain and converts the thermometer code to a 1-out-of-$2^N$ code (N being the number of bits). Finally, a 4-bit Gray code is produced, using a dynamic logic based ROM-table, and buffered at the output. Although Gray coding is rather tolerant to single bit errors, the first-order bubble correction block avoids the risk that, for very fast input signal, small timing differences between the responses of the comparators cause the temporary selection of two consecutive ROM locations. Design robustness and dynamic performance are consequently improved incurring in negligible power and area penalties.

Pulsed UWB applications can operate with a resolution as low as 4 bits but at high conversion rates. Therefore, the design is tailored to meet 3.5 minimum Effective Number of Bits (ENOB) at 1 GS/s. Additional specifications include: (i) 200 mV peak-to-peak input differential voltage; (ii) one clock cycle latency. The dynamic architecture selected for the design allows drastic power savings during ADC inactivity, which is a desirable feature in energy constrained systems. In addition, latency requirements guarantee that the converter can be switched off almost immediately after the last input sample has been acquired and converted.

Figure 2:
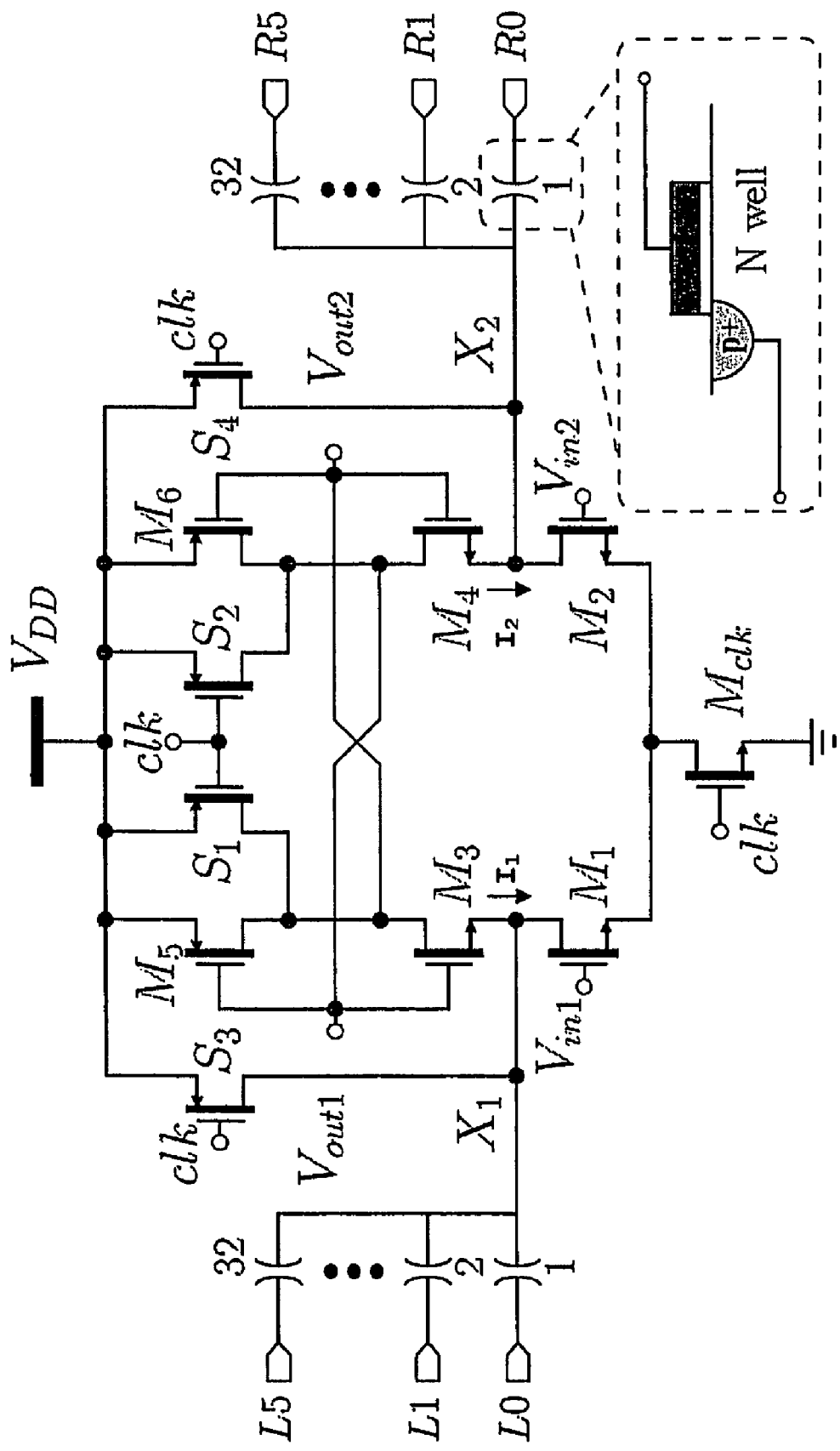
FIG. 2 represents a dynamic voltage comparator device provided with calibration devices.

The core of the ADC is the voltage comparator device. The architecture used in this design is a fast dynamic regenerative structure, the schematic diagram of which is represented in FIG. 2. The clk signal sets the operating phase of the comparator. When clk is low, switches $S_1$, $S_2$, $S_3$, $S_4$ reset the comparator pushing the output nodes (i.e. $V_{out1}$ and $V_{out2}$) and nodes $X_1$ and $X_2$ up to $V_{DD}$. After the comparator is cleared of the previous output, clk goes high and the input differential voltage is sensed. A decision is then taken by the regenerative back-to-back inverter pairs $M_{3:5}$-$M_{4:6}$. The evaluation phase can be divided in two sub-phases. At first, $M_1$ and $M_2$ operate in saturation regime, the output nodes are discharged almost linearly and the cross-coupled inverters are off. In this phase, any voltage difference between $V_{in1}$ and $V_{in2}$ generates an imbalance between the drain currents $I_1$ and $I_2$ so that the discharge rate of the outputs is not the same. As a consequence, a voltage difference appears between the output nodes. The second phase begins when the output voltages drop approximately to $V_{DD}+V_{Tp}$ ($V_{Tp}$ is the threshold voltage of the PMOS transistors). At this point, the inverters $M_{3:5}$, $M_{4:6}$ start to conduct and a strong positive feedback amplifies the output voltage difference set by the previous (slewing) phase. No current flows in the circuit after the transition is complete so that the comparator does not dissipate any static power.

Due to the time-varying nature of the circuit, it is not easy to derive an accurate analytical model for sizing the transistors. In fact, in the slewing phase, the discharge time is determined by the discharge current $I_0$ set by the $M_{clk}$ switch and the capacitances at nodes $X_1$, $X_2$, $V_{out1}$ and $V_{out2}$. In the regenerative phase, the time constant is primarily determined by the approximate expression:

$$T_R = \frac{(g_{ds1} + g_{m3})C_{out}}{g_{ds1}(g_{m3} + g_{m5}) + g_{m3}g_{m5}}, \qquad (\text{eq. 1})$$

which reduces to $C_{out}/(g_{m3}+g_{m5})$ when $g_{ds1} \gg g_{m3}, g_{m5}$. The computation of the small signal parameters is problematic since no 'traditional' bias point is reached. Simulations can be performed to extract design parameters and to determine device sizings while meeting the stringent requirement that a decision be taken in half a clock period, even when very small signals (much less than 100 µV) are applied. All transistor channel lengths are set to the minimum feature size to maximise speed and the widths have been also selected as small as possible to minimise the input differential capacitance while relying on digital calibration for mismatch compensation.

According to the traditional mismatch theory applied to differential pairs, undesired offset is caused by mismatch in transistor current factors and in threshold voltages due to process variability. In fact, any impairment in the $M_1$, $M_2$ pair results in an input offset voltage $V_{io}$ that needs to be compensated to establish symmetric operation. This result can be exploited to implement the ADC reference thresholds by creating an intentional imbalance in the widths of each comparator input pair devices. If a difference $\Delta W$ is deterministically imposed on the pair differentially so that $W_1 = (W+\Delta W/2)$ and $W_2 = (W-\Delta W/2)$, then the trip point of the comparator shifts by an amount that is linearly proportional to $\Delta W$. Using a square law based model and Taylor expansion for small $\Delta W/2W$ the total input referred offset needed to compensate for the drain current imbalance can be approximated as:

$$V_{io} \approx -\frac{(V_{GS} - V_{Tn})}{2}\frac{\Delta W}{W} - \frac{(V_{GS} - V_{Tn})}{32}\frac{\Delta W^3}{W^9} \qquad (\text{eq. 2})$$

where $V_{GS} = (V_{GS1}+V_{GS2})/2$ and $V_{Tn}$ denotes the threshold voltage of the NMOS input transistors. Using (eq.2) $\Delta W_0$ represents the imbalance corresponding to the first threshold level (1 LSB) and then all levels are generated using:

$$\Delta V_{th_i} = i\frac{(V_{GS} - V_{Tn})}{2}\frac{\Delta W_0}{W} \qquad (\text{eq. 3})$$

where i varies in $\{-7, \ldots, +7\}$. Trip points can indeed be assumed proportional to $\Delta W$ if the error (approximated by the third order term) on thresholds is negligible. In particular, requiring that INL<LSB/2 the following condition for the ADC resolution n is obtained $$\frac{\Delta W_0^2}{W^2} \leq \frac{8}{(2^{n-1}-1)^3}. \qquad \text{(eq. 4)}$$

INL has been computed at the boundaries of the input signal where the cubic term in (eq. 2) is maximum. In the case of $\Delta W_0 = W = 4.8\%$ linearity deviations become influent only for $n>6$ thus making it feasible to reach 4 bit accuracy through (eq. 3).

In the proposed architecture, intentional mismatch lowers the overall common mode rejection ratio (CMRR). Moreover, the comparator trip points become more sensitive on process variability, power supply and other environmental factors. These problems are addressed implementing a calibration scheme that allows achieving almost ideal performance.

The reference thresholds imposed by intentional imbalance in the comparators have to be guaranteed in the presence of an offset due to device mismatch, that is also penalised because of the absence of static pre-amplification. Threshold calibration is performed using a dynamic technique, through binary-scaled arrays of variable capacitors added at the drain nodes of the input pair $X_1$ and $X_2$. A difference $\Delta C = C_1 - C_2$ at the drain nodes need to be compensated by a corresponding difference $\Delta I = I_1 - I_2$ in the discharging currents during the slewing phase of the comparator operation. This difference translates into a shift in the comparator trip point given by:

$$V_{OD} = \frac{I}{g_{m1}} \frac{\Delta C}{C} = \frac{V_{GS} - V_{Tn}}{2} \frac{\Delta C}{C} \qquad \text{(eq. 5)}$$

where $C = C_1 + C_2 = 2$, $I = I_1 + I_2 = 2 = I_0 = 2$ and $g_{m1}$ is the transconductance of the input pair. A switchable array of capacitors is implemented using devices similar to half of PMOS transistors with only a gate controlling the value of the capacitance and a source connected to the comparator node, as shown in FIG. 2. If the gate voltage is low, the gate-channel capacitance is added at the comparator node and the device is enabled. In contrast, if a high gate voltage is applied only parasitic capacitances are present and the device is basically disabled. To minimise overlap and junction capacitances, PMOS source areas are shared between adjacent devices in the layout.

Figure 3:
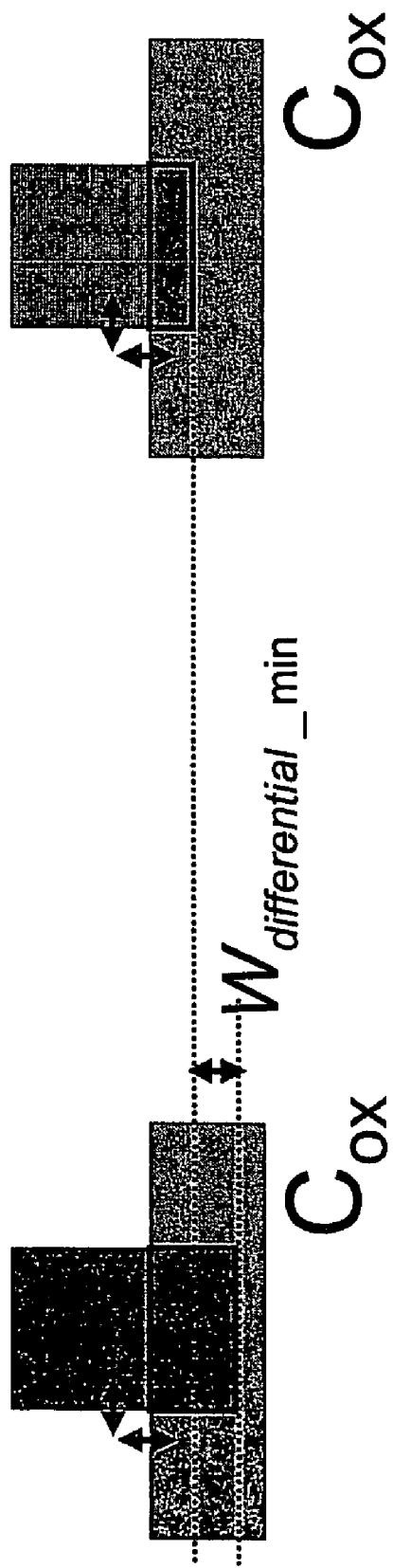
FIG. 3 represents differential half MOS transistors.

To overcome the misalignment caused by using overlap capacitances in a (self-aligned) CMOS process, a differential structure is proposed for the variable capacitances. This is shown in FIG. 3. The drawn structures are attached to nodes $X_1$ and $X_2$ and activated or deactivated together. The effect is that an additional differential capacitance is added to the nodes. These capacitances are both subject to the same misalignment and thus the difference is not. The size of the differential capacitance can be made extremely small which allows to compensate for smaller offset errors.

The insertion of additional capacitance slows the slewing phase of the comparator. On the other hand, as evident from (eq.5), the larger the total capacitive load, the smaller the minimum calibration step becomes (intended as the dynamic offset due to a minimum imbalance $\Delta C_{min}$). The accuracy of the calibration scheme must therefore be traded off with comparator speed at design time. The input referred offset has been determined using an automated extraction procedure, which allows avoiding expensive statistical simulations. In fact, exploiting standard mismatch models the total offset variance $\sigma_{OR}^2$ can be expressed as:

$$\sigma_{OR}^2 = \sum_{i=1}^{N} \left[ \left(\frac{\partial v_{OR}}{\partial V_{Ti}}\right)^2 \sigma_{V_{Ti}}^2 + \left(\frac{\partial v_{OR}}{\partial \beta_i}\right)^2 \sigma_{\beta_i}^2 \right] \qquad \text{(eq. 6)}$$

where N is the total number of transistors and the standard deviations ($\sigma_{V_{Ti}}$, $\sigma_{V_{tp}}$) are expressed in terms of transistor sizes and technology constants. The partial derivatives in (eq. 6) are determined through finite difference methods according to the following approximation:

$$\frac{\partial v_{OR}}{\partial X_i} \approx \frac{\Delta v_{OR}}{\Delta X_i} = \frac{v_{OR,X_i}}{\sigma x_i} \qquad \text{(eq. 7)}$$

Based on (eq. 7) a number of electrical simulations have been performed by applying for every statistical variable its a value, and leaving all other variables at their mean value. The offset in these conditions is extracted through a bi-section method based root finder. Finally, the evaluation of (eq. 6) produces a $\sigma_{OR}$ of approximately 12 mV. As a consequence, the capacitor array has been sized to provide a minimum correction voltage less than LSB/2 and a maximum correction voltage larger than the $\sigma_{OR}$ worst case. Six binary scaled devices per side have been used requiring a 12 bit digital calibration word for each comparator.

Calibration is performed off-line during a period of inactivity of the ADC. The calibration range available with the capacitor array can be further widened varying the input pair overdrive by setting the input common mode voltage. It is thus possible to allow flexible tuning of the converter thresholds for different dynamic ranges and different LSB values.

The ADC back-end consists in a 2 or 3-input AND gate chain, connected as in FIG. 1, to detect the transitions from zero to one in the thermometer code, and a custom designed Gray encoded ROM. The ROM is driven by two non-overlapping clock phases generated by a clock buffering circuit. Most of the bubble correction schemes proposed in the literature require additional circuitry, which increases power consumption and delay. The amount of cascaded logic stages is decreased as much as possible to get 1 clock cycle latency, so that the sample taken at the rising edge of one clock cycle is available at the rising edge of the next clock cycle.

A high-speed, large analogue bandwidth and power scalable ADC with sufficient accuracy for ultra-wide band signal detection in ultra-low power wireless receivers has been described. The ADC can be implemented using a 0.18 μm CMOS technology. A flash architecture based on dynamic comparators with built-in thresholds is used to limit DC power dissipation. The accuracy lost in the analogue portion of the system in order to save power and increase speed is successfully recovered with a digital calibration, which enhances the converter performance.

The proposed architecture is well suited for interleaved systems and can support different receiver topologies operating both at Nyquist and sub-sampling rates. The figure of merit of 0.8 pJ/conversion-step at maximum sampling frequency and Nyquist conditions proves the efficiency of the proposed design when compared to recently published designs implemented with similar or even more advanced technologies.

Figure 4:
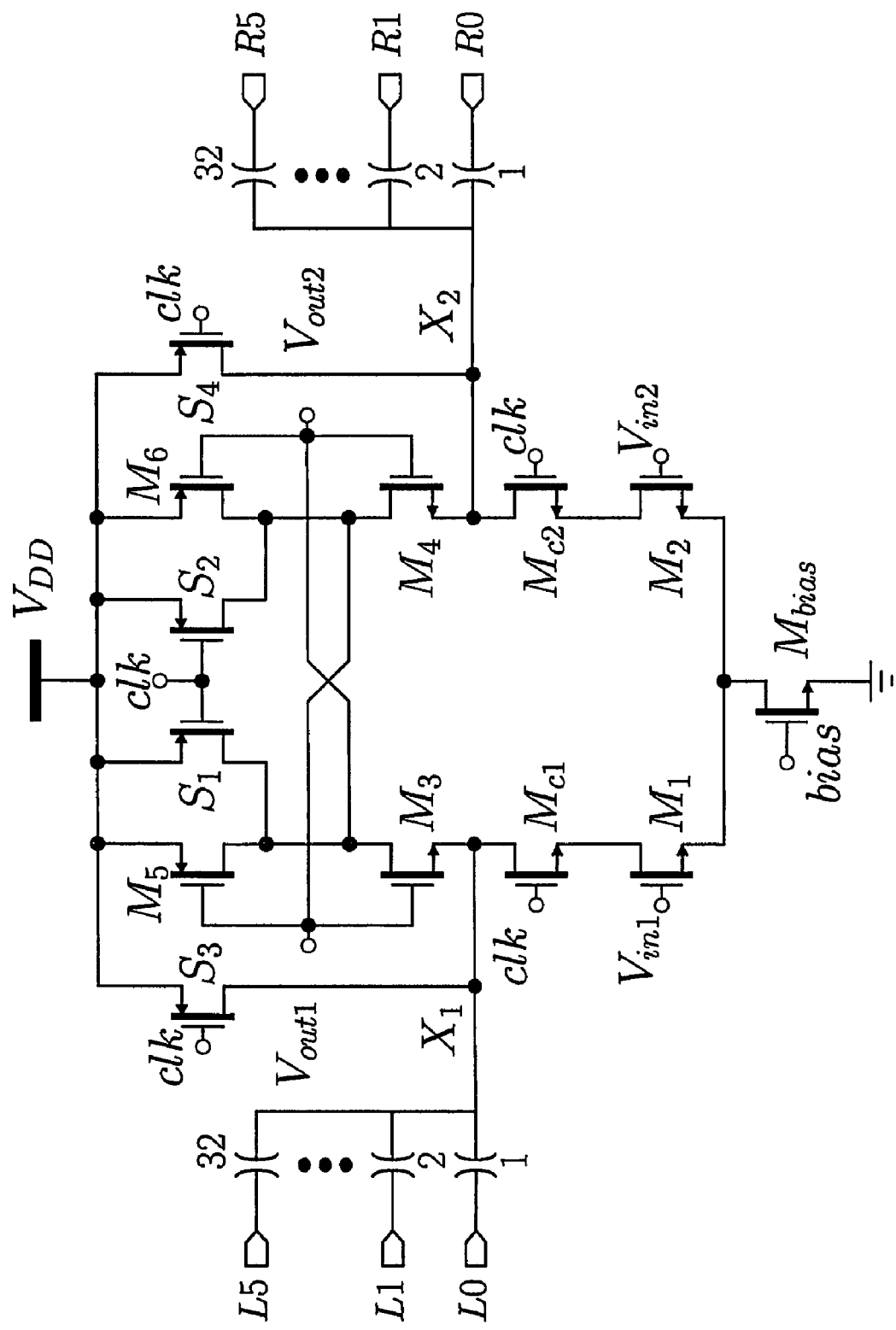
FIG. 4 represents an embodiment of the present invention suitable for reducing kickback noise.

FIG. 4 shows a further improvement of the scheme of FIG. 2. The main advantage of the circuit of FIG. 4 over that of FIG. 2 is that it is capable of dealing with the kickback noise.

This kickback noise is caused by the switching action injecting a substantial charge into the input circuit driving the ADC. The phenomenon of kickback noise on A/D converters is well known in the art, see e.g. the paper 'A kick-back reduced comparator for a 4-6 bit 3-GS/s flash ADC in a 90 nm CMOS process' (T.Sundström et al., Mixdes 2007, Ciechocinek, Poland, 21-23 Jun. 2007, pp. 195-198). As kickback, and especially differential kickback, deteriorates accuracy, an input buffer or driver is required with low output impedance. At near gigahertz bandwidth the power consumption of a suitable driver cannot be neglected in comparison with the power consumption of the ADC itself.

In the scheme of FIG. 4 a substantial reduction of the kickback noise is achieved by modifying the comparators. The strong reduction in kickback noise is achieved more in particular by placing a clocked cascode between the input stage (bottom) and the regenerative stage (top). This reduces the charges on the gate-drain capacitance of the input transistors which are responsible for the kickback noise. Reducing the kickback noise eases the demands (sufficiently low output impedance) on the ADC driver and brings the overall power consumption down.

Figure 5A:
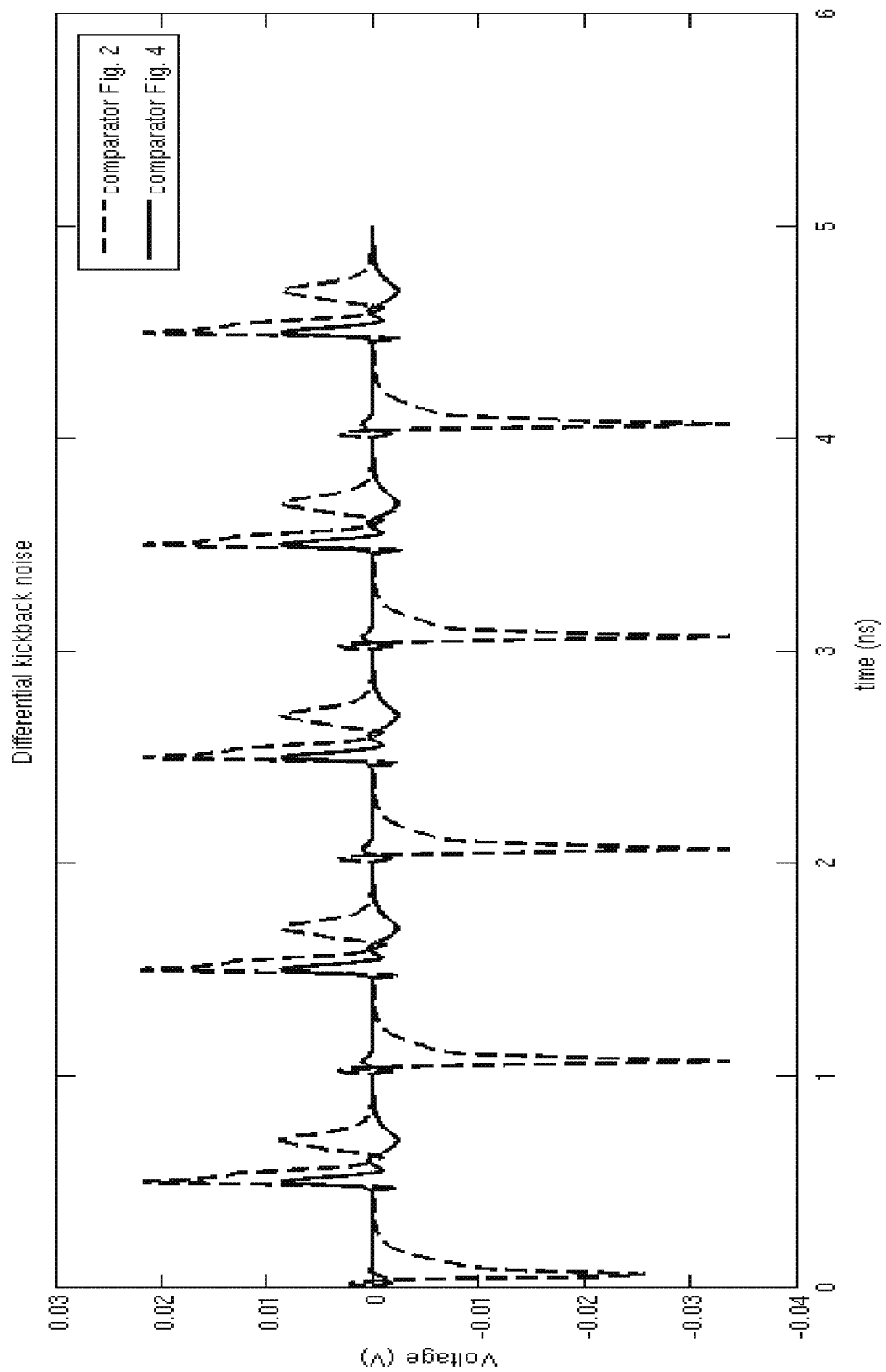
FIG. 5A shows the result for differential mode kickback and FIG. 5B for common mode feedback.
Figure 5B:
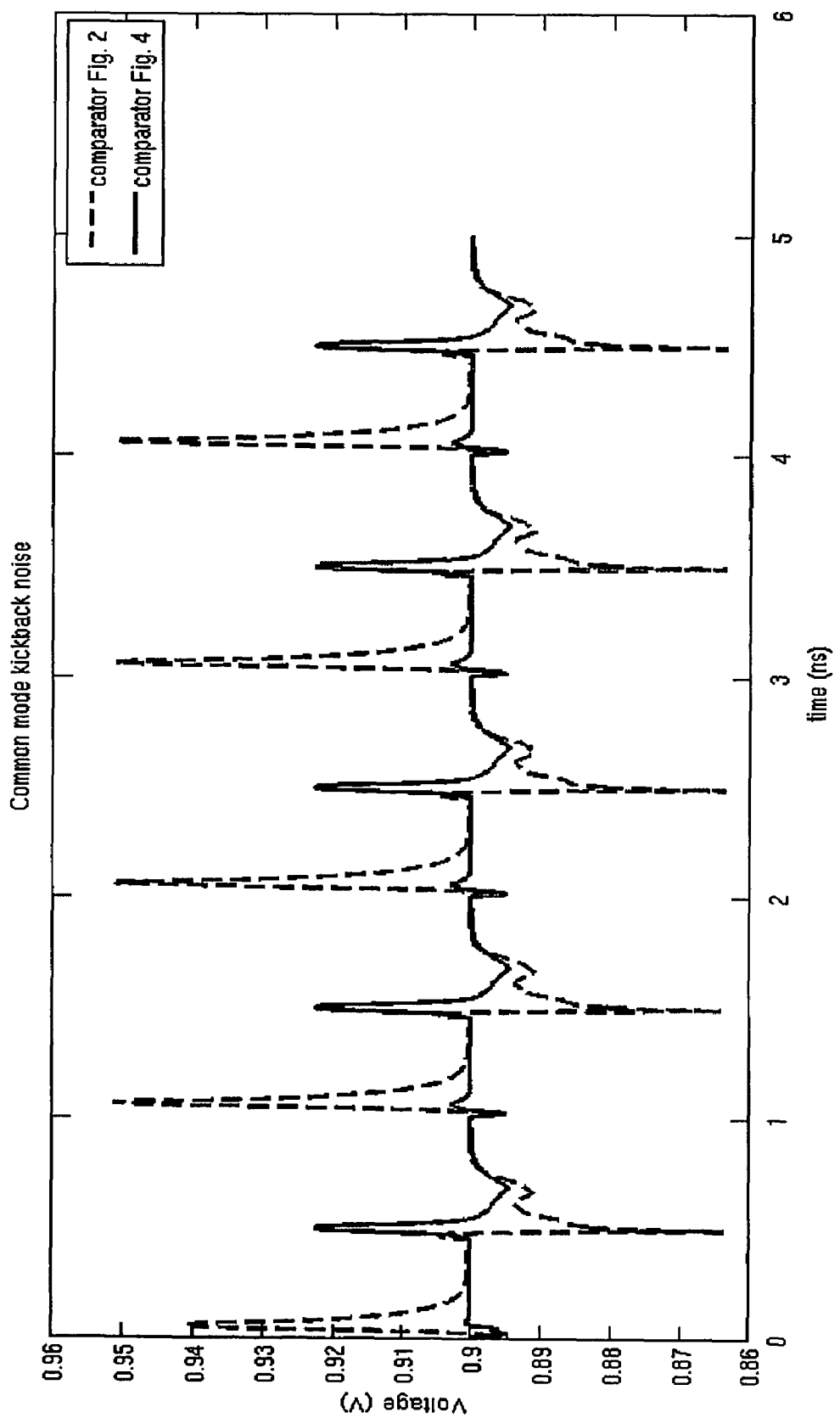
FIG. 5 illustrates the performance improvement achieved with the embodiment of FIG. 4.

The resulting improvement is shown in FIG. 5 by the waveforms of the differential kickback (FIG. 5A) and common mode kickback (FIG. 5B) voltages. The figures are obtained by simulation at 1 GigaSample/s (GSps) with a differential input of 0V and common mode voltage of 900 mV, when the comparator input is terminated into an input resistance of 1 k$\Omega$. The used comparators have a threshold voltage of −93.33 mV.

Implemented in a CMOS 0.18 micron technology, and operated at 1 GSps, the ADC of FIG. 4 consumes 8.12 mW including two single ended 500 MHz unity gain buffers (to drive the negative and positive input of the ADC with an accuracy better than 3.7 effective number of bits, as in the design of FIG. 2). This yields a FoM of 0.64 pJ/conv@1 GSps, compared to 0.8 pJ/conv@1 GSps for the design without buffer, which consumes 10.6 mW. Note that the A/D converter of FIG. 4 still makes use of the offset in the input transistor to determine the threshold voltage. No permanent voltage reference is needed.

The improved performance of the ADC design as shown in FIG. 4 is achieved by combining two important principles: it makes use of the offset in the input transistors width and of clocked cascodes.

Figure 6:
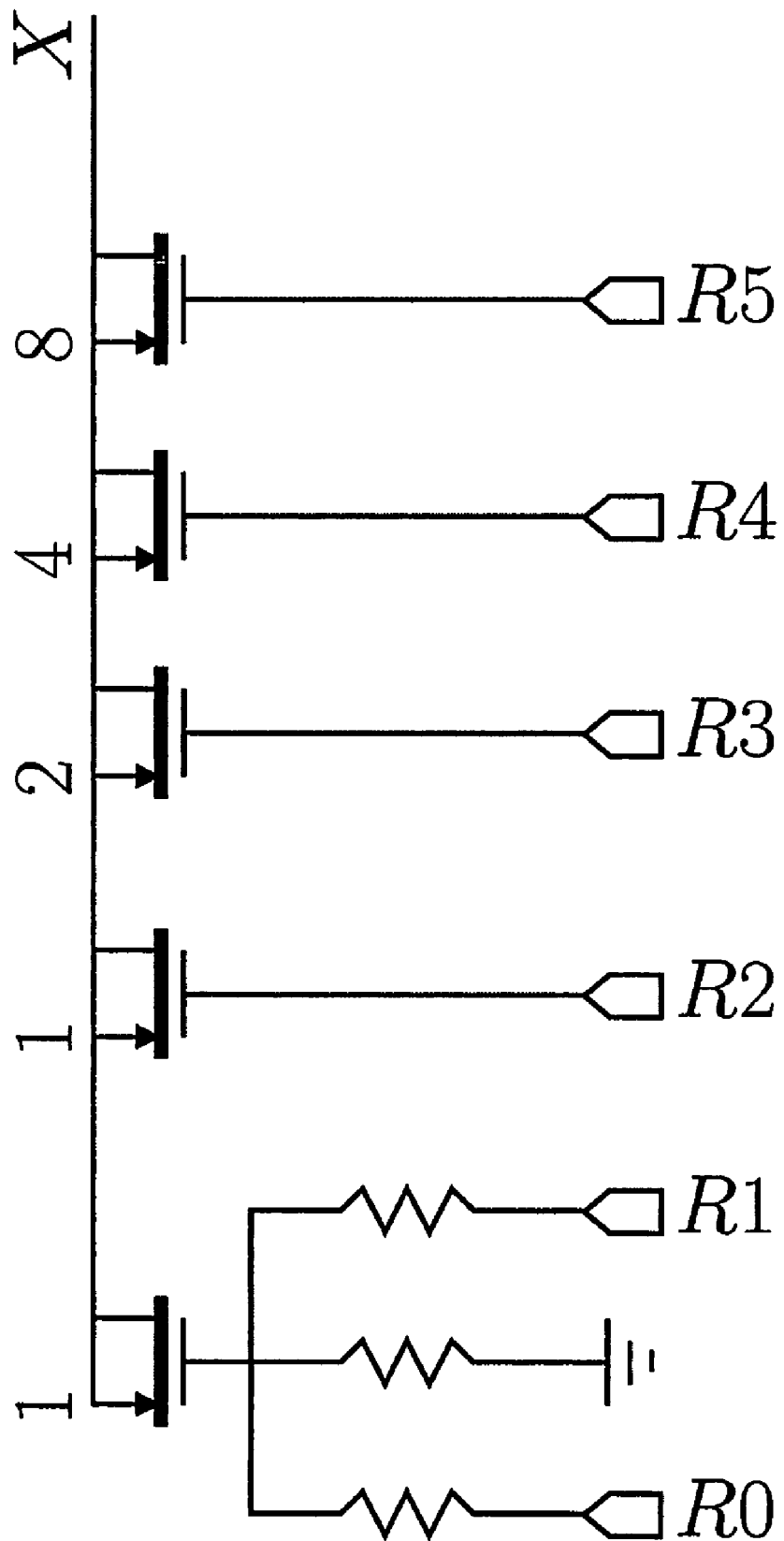
FIG. 6 shows a calibration capacitor array allowing further improvement.

A further improvement is shown in FIG. 6. FIG. 6 shows a calibration capacitor array to be connected to nodes X1 and X2 in FIG. 2 or FIG. 4. In FIG. 2 the smallest calibration capacitor is determined by the minimum size of the gate area. In FIG. 6 smaller capacitor values are obtained by reducing the gate-source voltage of the pmos transistor. In this way the calibration of the integral non-linearity becomes more accurate. At the right hand side of FIG. 6 the pmos capacitors driven by R2, R3, R4 and R5 form a binary weighed capacitor array (relative areas 1, 2, 4 and 8). At the left hand side a minimum sized pmos capacitor (relative area 1) is driven by logic signals R0 and R1, scaled/added by a resistive divider to obtain 0, 0.25, 0.5 and 0.75 times the minimum capacitance.

The invention claimed is:

1. An analogue-to-digital (A/D) converter comprising at least two voltage comparator devices, each of said voltage comparator devices arranged for being fed with a same input signal and for generating an own internal voltage reference, said at least two internal voltage references being different, wherein each of said voltage comparator devices comprising a clocked cascode placed in between an input stage and a regenerative stage of said A/D converter, thereby reducing kick-back noise, and wherein each of said voltage comparator devices is arranged for generating an output signal indicative of a bit position of a digital approximation of said input signal.

2. The A/D converter as in claim 1, wherein all of said voltage comparator devices comprise a plurality of transistors and whereby said internal voltage reference is realized by configuring at least one of said transistors such that a voltage imbalance is achieved between the output signals of said voltage comparator devices.

3. The A/D converter as in claim 2, wherein at least one of said voltage comparator devices further comprises capacitors for calibrating transistor mismatches.

4. The A/D converter as in claim 1, wherein at least one of said voltage comparator devices further comprises capacitors for calibrating transistor mismatches.

5. The A/D converter as in claim 4, wherein said capacitors are switchable.

6. The A/D converter as in claim 5, wherein at least one of said capacitors is configured in a differential structure.

7. The A/D converter as in claim 5, further comprising a memory device for storing calibration information for selecting said capacitors for calibrating transistor mismatches.

8. The A/D converter as in claim 4, wherein said capacitors are switchable driven by a fraction of a logic voltage/signal arranged for reducing an integral non-linearity.

9. The A/D converter as in claim 8, wherein at least one of said capacitors is configured in a differential structure.

10. The A/D converter as in claim 8, further comprising a memory device for storing calibration information for selecting said capacitors for calibrating transistor mismatches.

11. The A/D converter as in claim 4 wherein at least one of said capacitors is configured in a differential structure.

12. The A/D converter as in claim 4 further comprising a memory device for storing calibration information for selecting said capacitors for calibrating transistor mismatches.

13. An analogue-to-digital (A/D) converter comprising:
   at least two voltage comparator devices, each of said voltage comparator devices arranged for being fed with a same input signal and for generating an own internal voltage reference, each of said internal voltage references being different,
   wherein each voltage comparator is arranged for generating an output signal indicative of a bit position of a digital approximation of said input signal,
   wherein said voltage comparator devices comprise a plurality of transistors and whereby said internal voltage reference is realized by configuring at least one of said transistors such that a voltage imbalance is achieved between the output signals of said at least two voltage comparator device,
   wherein said voltage comparator devices comprise clock cascodes placed in between an input stage and a regenerative stage of said A/D converter, thereby reducing kick-back noise, and
   wherein at least one of said voltage comparator devices further comprises capacitors for calibrating transistor mismatches.

14. The A/D converter as in claim 13, wherein at least one of said capacitors are configured in a differential structure.

15. The A/D converter as in claim 13, further comprising a memory device for storing calibration information for selecting said capacitors for calibrating transistor mismatches.

16. An ultra-wide band receiver comprising an analogue-to-digital (A/D) converter, wherein the A/D converter comprises at least two voltage comparator devices, each of said voltage comparator devices arranged for being fed with a same input signal and for generating an own internal voltage reference, each of said internal voltage references being different, wherein each voltage comparator is arranged for generating an output signal indicative of a bit position of a digital approximation of said input signal, and wherein said voltage comparator devices comprise clock cascodes placed in between an input stage and a regenerative stage of said A/D converter, thereby reducing kick-back noise.

17. The ultra-wide band receiver as in claim 16, wherein said voltage comparator devices comprise a plurality of transistors and whereby said internal voltage reference is realized by configuring at least some of said transistors such that a voltage imbalance is achieved between the output signals of said voltage comparator devices.

18. The ultra-wide band receiver as in claim 16, wherein at least one of said voltage comparator devices further comprises capacitors for calibrating transistor mismatches.

* * * * *